United States Patent
Chen

(10) Patent No.: US 6,182,835 B1
(45) Date of Patent: Feb. 6, 2001

(54) DEVICE FOR MOUNTING COMPUTER EXPANSION SLOT COVERS

(75) Inventor: Yun-Lung Chen, Chung-Ho (TW)

(73) Assignee: Hon Hai Precision Ind. Co., Ltd., Taipei Hsien (TW)

( * ) Notice: Under 35 U.S.C. 154(b), the term of this patent shall be extended for 0 days.

(21) Appl. No.: 09/346,178

(22) Filed: Jul. 1, 1999

(30) Foreign Application Priority Data

Jul. 2, 1998 (TW) .................................................. 87210606

(51) Int. Cl.[7] ....................................................... G12B 9/00
(52) U.S. Cl. .................. 211/13.1; 211/41.17; 211/181.1; 248/22.1; 361/726
(58) Field of Search ................................ 211/41.17, 13.1, 211/181.1; 248/674, 27.1; 361/183, 726, 736

(56) References Cited

U.S. PATENT DOCUMENTS

| | | | |
|---|---|---|---|
| 4,748,993 | * 6/1988 | Llewellyn | ..................... 211/181.1 X |
| 5,317,483 | * 5/1994 | Swindler | .............................. 361/801 |
| 5,575,546 | * 11/1996 | Radloff | ............................ 361/801 X |
| 5,757,618 | * 5/1998 | Lee | ................................... 361/801 X |
| 5,967,466 | * 10/1999 | Osborne et al. | ..................... 248/27.1 |

* cited by examiner

*Primary Examiner*—Daniel P. Stodola
*Assistant Examiner*—Erica B. Harris
(74) *Attorney, Agent, or Firm*—Wei Te Chung

(57) ABSTRACT

A mounting device for fixing covers to expansion slots defined in a rear panel of a computer enclosure includes an elongate body forming a plurality of depressing portions thereon for engaging with and depressing the covers against the rear panel. One end of the body forms a pivot portion pivotally attaching the mounting device to the computer enclosure and the other end forms a grasping portion to be grasped by a user for moving the mounting device between a released position and a secured position. A locking portion is formed between the grasping portion and the body for engaging with a corresponding hook formed on the computer to retain the mounting device in the secured position whereby the body is deformed and forces are imposed to the covers via the depressing portions thus fixing the covers to the enclosure.

5 Claims, 6 Drawing Sheets

DEVICE FOR MOUNTING COMPUTER EXPANSION SLOT COVERS

BACKGROUND OF THE INVENTION

1. Field of the Invention

The present invention relates to a device for mounting computer expansion slot covers, and more particularly to a device for mounting computer expansion slot covers to a rear panel of a computer enclosure without screws.

2. The Related Art

Slots are defined in a rear panel of a computer enclosure for exposing expansion cards mounted in card sockets of a motherboard. Each of the slots is covered by a cover. Conventionally, the covers are mounted to the enclosure by screws. As is well known, as far as the computer assembly is concerned, the assembly by means of screws is time-consuming and laborious, which hinders efficient assembly of computers.

Furthermore, when adding or replacing expansion cards, a computer user must unscrew and remove the covers and then reinsert the removed screw into the cover of the added expansion card. Often, more than one card must be dealt with, whereby a number of screws must be removed and then reinserted. Each time this task is carried out, there is a risk of dropping one or more screws in the computer enclosure causing inconvenience.

Thus, it is desired to provide a mounting device for readily fixing covers to a rear panel of a computer enclosure in order to overcome the above-mentioned problems.

SUMMARY OF THE INVENTION

An object of the present invention is to provide a mounting device for fixing covers to slots defined in a rear panel of a computer enclosure without screws.

Another object of the present invention is to provide a mounting device for fixing covers of expansion cards to a computer enclosure and forming grounding paths therebetween.

In accordance with the present invention, a mounting device for fixing covers to expansion slots defined in a rear panel of a computer enclosure includes an elongate body forming a plurality of depressing portions thereon for engaging with and depressing the covers against the rear panel. One end of the body forms a pivot portion pivotally attaching the mounting device to the computer enclosure and the other end forms a grasping portion to be grasped by a user for moving the mounting device between a released position and a secured position. A locking portion is formed between the grasping portion and the body for engaging with a corresponding hook formed on the computer to retain the mounting device in the secured position whereby the body is deformed and forces are imposed to the covers via the depressing portions thus fixing the covers to the enclosure.

DETAILED DESCRIPTION OF THE PREFERRED EMBODIMENTS

Figure 1:
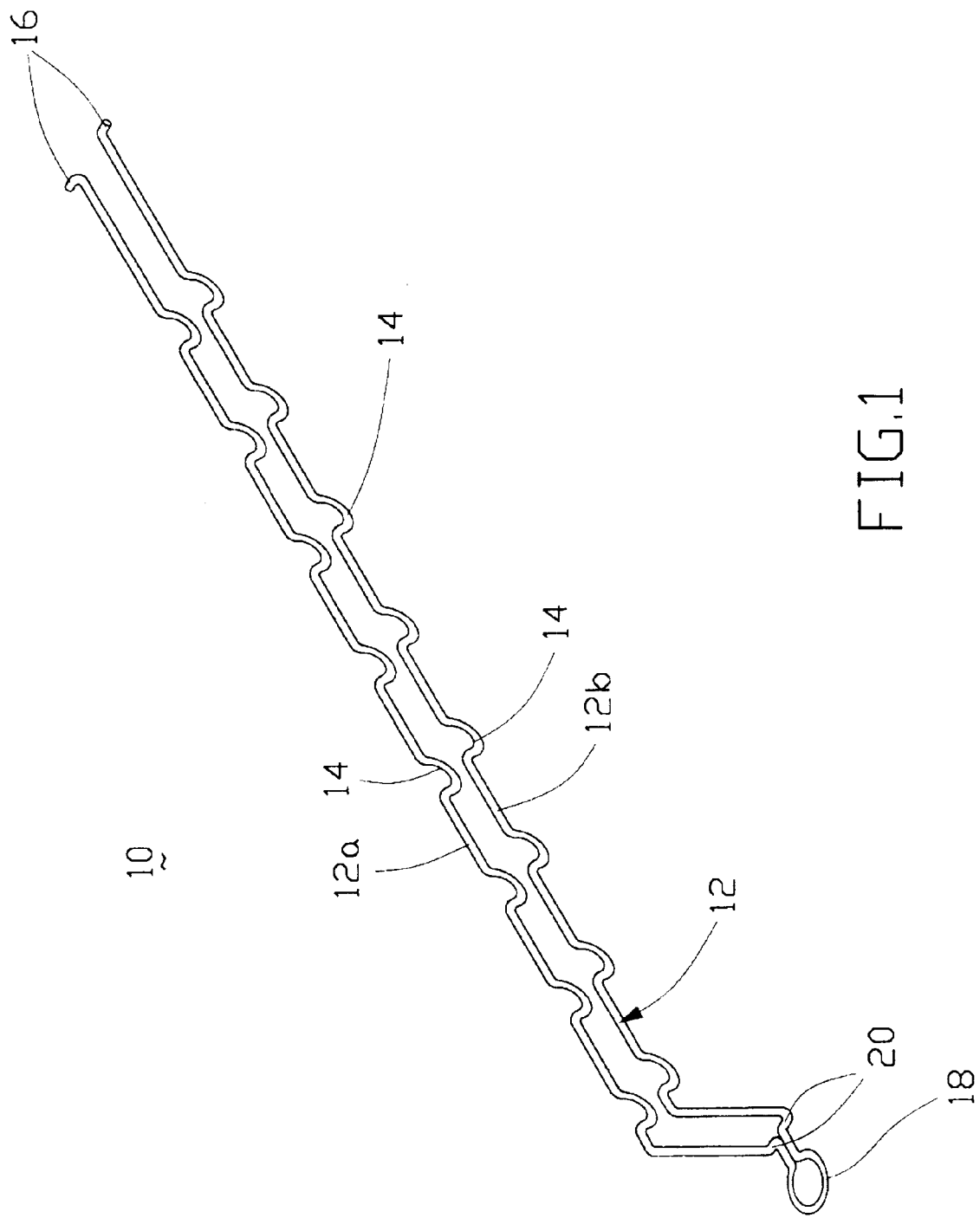
FIG. 1 is a perspective view of a mounting device in accordance with a first embodiment of the present invention.

Referring to FIG. 1, a mounting device 10 in accordance with a first embodiment of the present invention is made of bending a wire. The mounting device 10 comprises a body 12 having two elongate arms 12a, 12b parallel extending in a lengthwise direction and forming spaced depressing portions 14 thereon. Preferably, the depressing portions 14 are equally spaced along the body 12. A pair of pivots 16 is formed on a first end of the body 12 by bending an end portion of each arm 12a, 12b in opposite directions. A grasping portion 18 and a locking portion 20 are formed on a second end of the body 12. The grasping portion 18 allows a user to grasp it with hand for operating the mounting device 10. The lock portion 20 is formed between the body 12 and the grasping portion 18.

Figure 2:
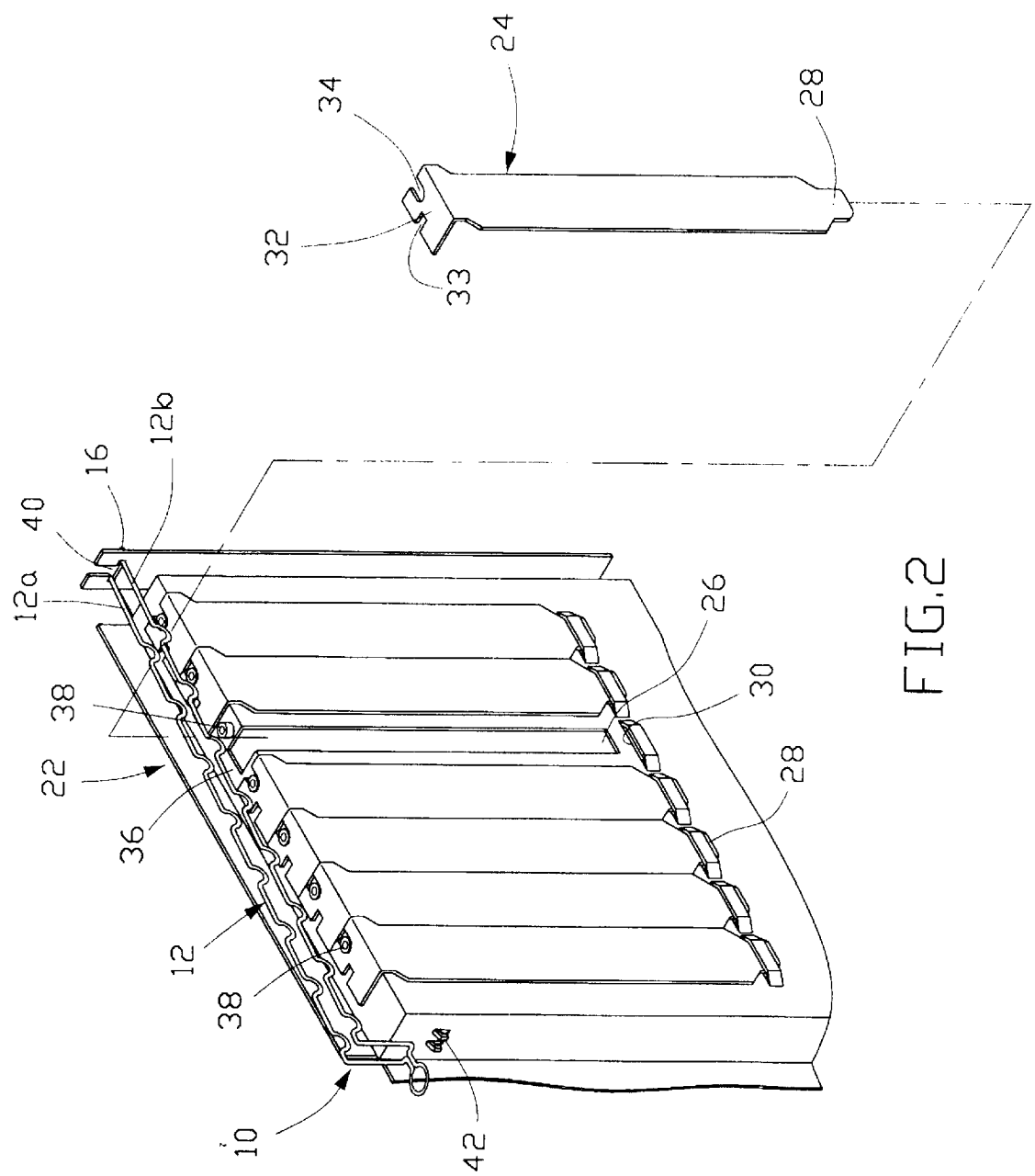
FIG. 2 is a perspective view of the mounting device mounted to a rear panel of a computer enclosure at a released position.
Figure 3:
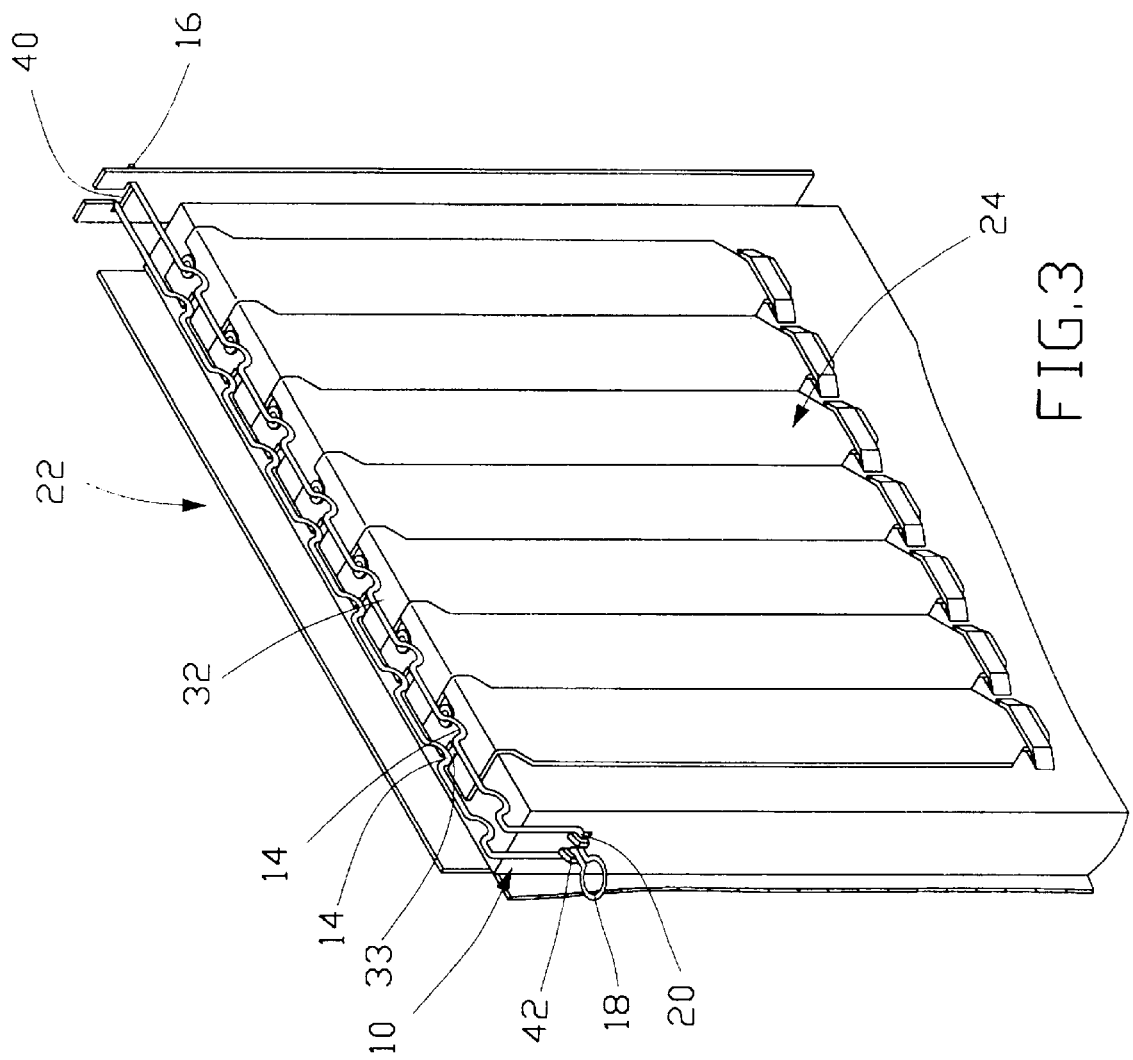
FIG. 3 is a perspective view of the mounting device at a secured position.

FIGS. 2 and 3 illustrate the mounting device 10 fixing expansion slot covers 24 to a computer enclosure 22. Elongate expansion slots 26 are defined in a rear panel (not labeled) of the computer enclosure 22 for exposing expansion cards (not shown). The slots 26 are selectively covered by the expansion slot covers 24. Each of the covers 24 has a reduced lower end 28 inserted into a corresponding hole 30 defined in the rear panel of the computer enclosure 22 and an outwardly bent tab 32 on an opposite upper end for being positioned on a corresponding terrace 36 of the rear panel of the computer enclosure 22. The tabs 32 each further define a notch 34 for receiving a corresponding upwardly projecting cylindrical guide boss 38 formed on the enclosure 22 for retaining the cover 24 to the enclosure 22. Each tab 32 defines a cutout 33 around the edge.

As best illustrated in FIG. 2, the arms 12a, 12b of the mounting device 10 that are made of resilient wires are resilient thereby facilitating deforming the arms 12a, 12b to insert the pivots 16 into a groove 40 defined in the rear panel for pivotally attaching the mounting device 10 to the enclosure 22. Therefore, the mounting device 10 is movable with respect to the enclosure 22 between a released position as shown in FIG. 2 and a secured position as shown in FIG. 3.

As illustrated in FIG. 3, the grasping portion 18 of the mounting device 10 is grasped by the user and forced downwardly for engaging the locking portions 20 with hooks 42 formed on the computer enclosure 22 thereby securing the mounting device 10 to the enclosure 22. The arms 12a, 12b are deformed imposing forces on the tabs 32 of the covers 24 through the depressing portions 14 of both two arms 12a, 12b. Thereof thereby securing the covers 24 to the rear panel of the computer enclosure 22. The depressing portions 14 of one arm 12a further are receiveably engaged within the corresponding cutouts 33 of the tabs 32, respectively, for restraining horizontal movement of the tabs 32. By disengaging the locking portions 20 from the hooks 42, the mounting device 10 is released and the covers 24 are unfastened.

By means of the engagement between the depressing portions 14 and the tabs 32 of the covers 24, a grounding path is formed between the covers 24 and the enclosure 22.

Figure 4:
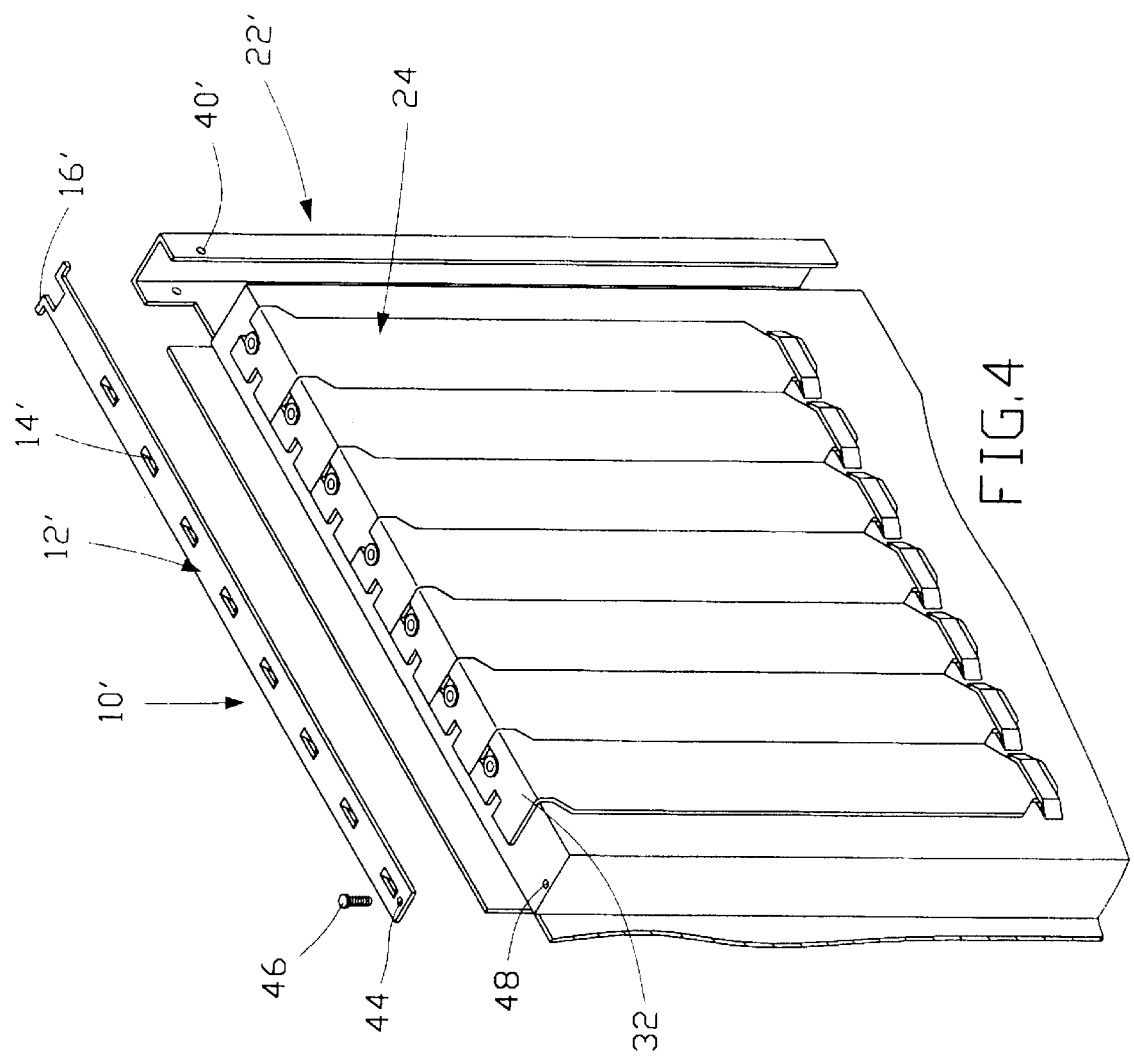
FIG. 4 is an exploded view of a mounting device in accordance with a second embodiment of the present invention for fixing covers to a rear panel of a computer enclosure.

FIGS. 4 illustrates a second embodiment of the mounting device 10' of the present invention. The mounting device 10' is made from a metal sheet, comprising an elongate body 12' forming spaced depressing portions 14' thereon and a pair of pivots 16' on a first end thereof. The depressing portions 14' are arcuate projections stamped from the body 12' for engaging with and depressing the tabs 32 of the covers 24. The pivots 16' are received in holes 40' defined in the computer enclosure 22' thereby the mounting device 10' is movable between a released position and a secured position. A hole 44 is defined in the body 12' proximate an opposite second end thereof for receiving a bolt 46 engaging with a screw hole 48 defined in the enclosure 22' to fasten the mounting device 10' to the computer enclosure 22' and thus securing the covers 24 to the rear panel by means of forces imposed thereon caused by deformation of the body 12'.

Figure 5:
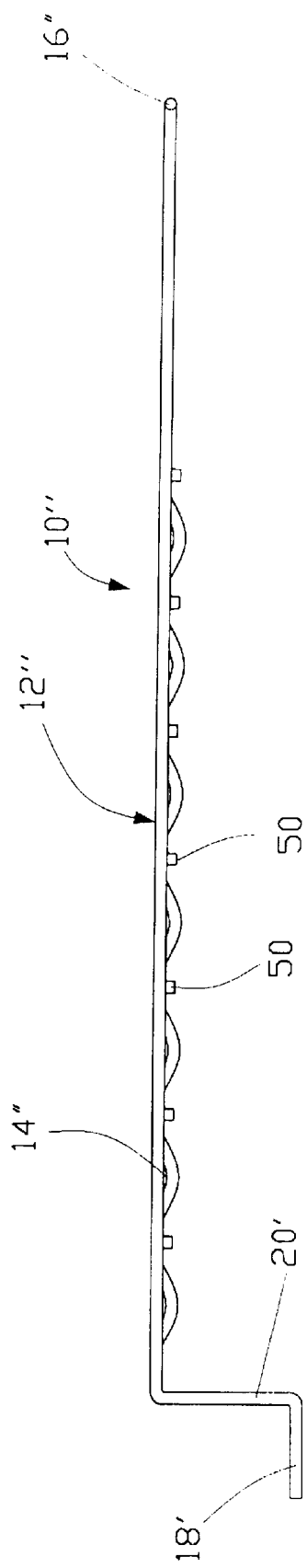
FIG. 5 is a side view of a mounting device in accordance with a third embodiment of the present invention.
Figure 6:
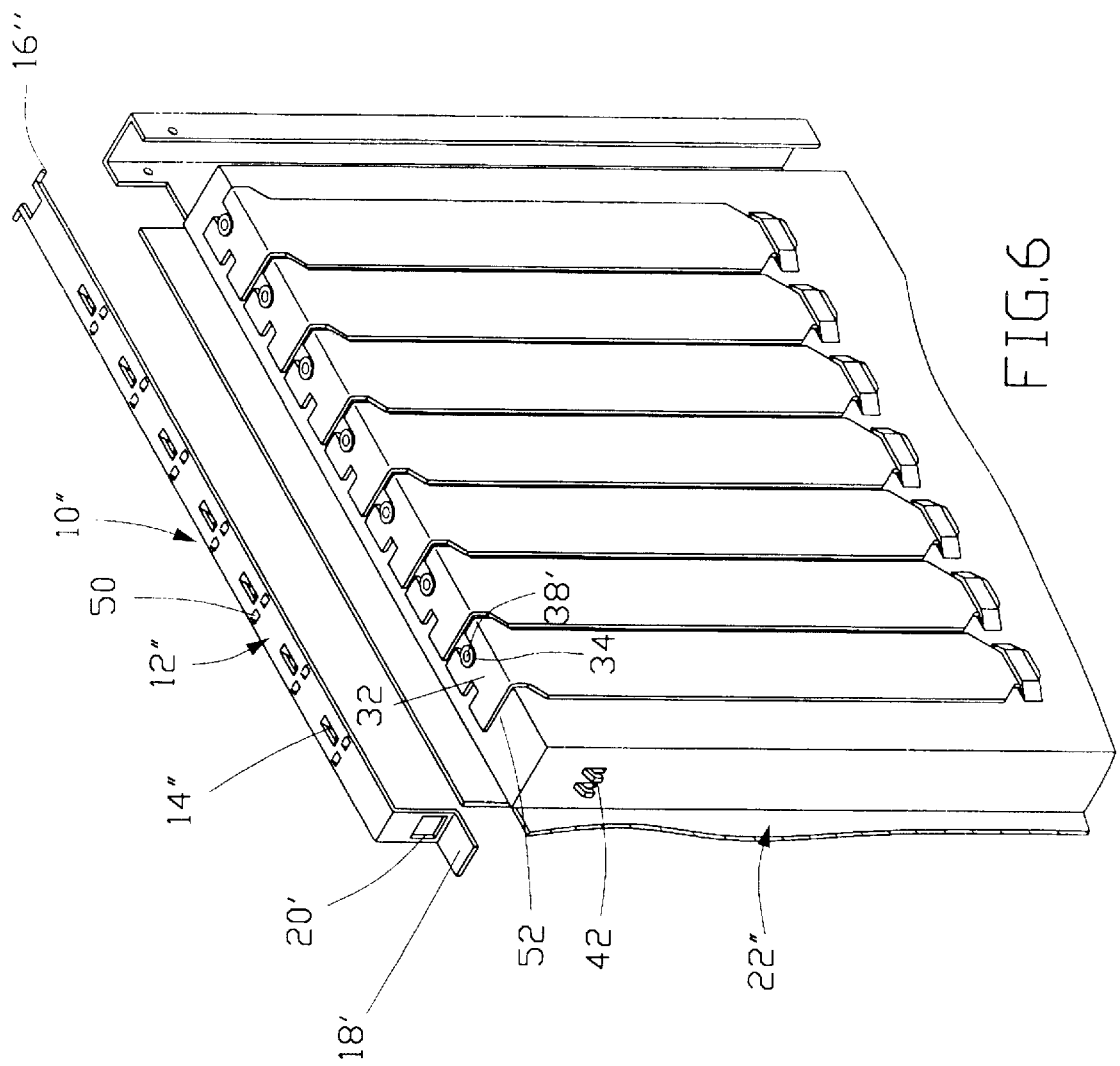
FIG. 6 is an exploded view of the mounting device of FIG. 5 for fixing covers to a rear panel of a computer enclosure.

FIGS. 5 and 6 illustrate a third embodiment of the mounting device 10" of the present invention. The mounting device 10" comprises an elongate body 12" forming spaced depressing portions 14" thereon and a pair of pivots 16" on a first end thereof. A grasping portion 18' and a locking portion 20' are formed on a second end of the body 12". A protrusion 50 is formed on the body 12" associated with each depressing portion 14" for engaging side edge 52 of the tab 32 of each cover 24 whereby the tabs 32 are firmly secured in position by the protrusions 50 and the associated cylindrical bosses 38.

While the present invention has been described in reference to specific embodiments thereof, the description is illustrative and is not to be construed as limiting the invention. Various modifications to the present invention may be made to the preferred embodiments by those skilled in the art without departing from the spirit and scope of the invention as defined by the appended claims.

I claim:

1. A mounting device adapted to mount expansion slot covers to a computer enclosure, said mounting device comprising:

an elongate body comprising two opposing resilient arms, a plurality of spaced depressed portions being formed on at least one of the arms;

pivot means adapted to pivotally attach the mounting device to the computer enclosure to allow the mounting device to move between a released position and a secured position where the depressed portions of the body engage and depress the covers against the computer enclosure for firmly securing the covers in position; and locking means for releasably engaging with the enclosure to retain the mounting device in the secured position.

2. The mounting device as claimed in claim 1, wherein the depressed portions are equally spaced along the at least one arm.

3. The mounting device as claimed in claim 1, wherein the locking means comprises hook means formed on the computer enclosure for engaging portions of the arms.

4. The mounting device as claimed in claim 1, wherein the body forms a grasping portion for manual movement of the mounting device between the released position and the secured position.

5. An arrangement of securing mount expansion slot covers to a rear panel of an enclosure, comprising:

a plurality of mount expansion slot covers, each of said mount expansion slot covers defining a cutout;

means provided on each of said mount expansion slots covers and the rear panel for retaining each said mount expansion slot cover to the rear panel and restraining movement of said mount expansion slot cover except in an upward direction;

a single mounting device comprising an elongated body extending across all of the mount expansion slot covers and restraining upward movement of said mount expansion slot covers, said elongated body including two arms spatially extending in a lengthwise direction thereof in a parallel relation, each arm forming a plurality of depressing portions thereon; wherein the depressing portions of both said arms abut against the corresponding mount expansion slot covers, respectively, for preventing upward movement of the mount expansion slot covers, and the depressing portions of one of said arms further are receiveably engaged within the cutouts of the mount expansion slot covers, respectively, for preventing horizontal movement of the mount expansion slot covers.

* * * * *